United States Patent [19]

Hogan, Jr. et al.

[11] Patent Number: 4,841,456
[45] Date of Patent: Jun. 20, 1989

[54] TEST SYSTEM AND METHOD USING ARTIFICIAL INTELLIGENCE CONTROL

[75] Inventors: Thomas J. Hogan, Jr., Enumclaw; Jon J. Kasprick, Federal Way; Donald R. Anderson, Auburn; Douglas W. Kersh, Seattle, all of Wash.

[73] Assignee: The Boeing Company, Seattle, Wash.

[21] Appl. No.: 906,104

[22] Filed: Sep. 9, 1986

[51] Int. Cl.[4] .......................................... G01R 31/28
[52] U.S. Cl. ..................... 364/550; 371/20; 371/25; 371/26; 324/73 PC; 324/73 AT
[58] Field of Search ... 364/550, 551, 513, 200 MS File, 364/900 MS File, 300; 324/73 AT, 73 R, 73 PC; 371/15, 20, 25, 26

[56] References Cited

U.S. PATENT DOCUMENTS

| | | | |
|---|---|---|---|
| 3,832,535 | 7/1974 | De Vito | 324/73 AT X |
| 4,055,801 | 10/1977 | Pike et al. | 324/73 R |
| 4,070,565 | 1/1978 | Borrelli | 364/490 |
| 4,255,792 | 3/1981 | Das | 364/520 |
| 4,402,055 | 8/1983 | Lloyd et al. | 364/579 |
| 4,434,489 | 2/1984 | Blyth | 371/29 |
| 4,455,654 | 6/1984 | Bhaskar et al. | 371/20 |
| 4,458,197 | 7/1984 | Robinson | 324/73 A |
| 4,459,695 | 7/1984 | Barratt et al. | 324/73 R |
| 4,517,512 | 5/1985 | Petrich et al. | 324/73 R |
| 4,550,406 | 10/1985 | Neal | 371/20 |
| 4,622,647 | 11/1986 | Sagnard et al. | 324/73 AT |
| 4,628,435 | 12/1986 | Tashiro et al. | 364/130 |
| 4,630,224 | 12/1986 | Sollman | 364/550 |
| 4,642,782 | 2/1987 | Kemper et al. | 364/550 |
| 4,644,479 | 2/1987 | Kemper et al. | 364/550 |
| 4,649,515 | 3/1987 | Thompson et al. | 364/900 |
| 4,691,287 | 9/1987 | Suzuki et al. | 364/490 |
| 4,709,366 | 11/1987 | Scott et al. | 371/20 |

OTHER PUBLICATIONS

Hayes-Roth, "The Knowledge-Based Expert System: A Tutorial", Sep. 84, Computer, pp. 11–28.
Tim Finin, John McAdams, Pamela Kleinosky, "Forest—An Expert System for Automatic Test Equipment", IEEE CH2107-1/84/0000/0350, 1984, pp. 350–356.
Donald A. Waterman, *A Guide to Expert Systems*, Addison-Wesley Publishing Company, 1986, pp. ix–xvi, 118–121, 253–259, 306–309.
TEK Users Manual, 4400S02, OPS5 Production Rule System, Tektronix, Aug. 1985, 57 pages.

*Primary Examiner*—P. S. Lall
*Assistant Examiner*—Thomas G. Black
*Attorney, Agent, or Firm*—Christensen, O'Connor, Johnson & Kindness

[57] ABSTRACT

A testing arrangement in which an AI system is interfaced directly to an automatic test system (ATS) such that from the point of view of the ATS, the actions of the AI system are indistinguishable from the actions of an intelligent human operator. A testing apparatus comprises an automatic test system, communication means, and an AI system. The automatic test system comprises an automatic test equipment (ATE) controller, at least one test instrument connectable to the ATE controller and to the unit under test (UUT), and storage means for storing a functional test procedure (FTP) for the UUT. The ATE controller includes an I/O port and ATE data processing means for executing the FTP in response to a start FTP command, and for providing an FTP data set at the I/O port. The FTP data set comprises data indicating the results obtained by executing the FTP. The communication means is connected to the I/O port. The AI system comprises an AI data processor having an I/O port through which the AI data processor is connected to the communication means. The AI system also comprises means for receiving the FTP data set via its I/O port, and expert system means for processing the FTP data set when the FTP data set indicates that a failure has occurred to identify, if possible, the defective UUT portion that may have caused the failure. The expert system means also includes means for producing output data identifying the defective UUT portion. The automatic test system may also comprise a diagnostic test procedure (DTP) for the UUT which may run in response to a DTP request provided by the expert system means when the expert system means determines that further testing should be performed.

5 Claims, 4 Drawing Sheets

TEST SYSTEM AND METHOD USING ARTIFICIAL INTELLIGENCE CONTROL

FIELD OF THE INVENTION

The present invention relates to automatic test systems for electronic equipment, and to artificial intelligence systems.

BACKGROUND OF THE INVENTION

Current avionics systems exhibit high levels of both design complexity and functional reliability. Complexity of design implies that factory or depot-level repair technicians require extensive technical training in order to maintain line replaceable units (LRUs) or shop repairable units (SRUs). High LRU/SRU reliability implies that frequent maintenance of the units isnot required and, consequently, technician considered to be "experts" on specific rather than ganeric types of units often exhibit a large amount of nonproductivity. The alternative for factory or depot-level maintenance is to use "nonexpert" technicians for maintaining several types of LRUs/SRUs. Since these technicians are not skilled in the repair of all types of units, both maintenance time and documentation requirements per LRU/SRU are greatly increased.

In a typical factory or depot-level repair procedure, units under test (UUTs) are functionally tested on an automatic test system (ATS) to identify failed operational modes. The UUT may be a single circuit card taken from a large system, or a functional unit comprising several circuit cards. The ATS comprises an automatic test equipment (ATE) controller and an associated group of test instruments such as digital multimeters, waveform generators, counters, timers, and power supplies, a set of relay switches, and a load board containing loads (e.g., resistors) required to test certain circuits. The ATE controller is a computer running under the control of a program generally referred to as a functional test procedure (FTP). Each FTP is written and utilized for a particular UUT. The FTP instructs the ATE controller which signals to apply, which tests to perform, and what the results of these tests should be under normal circumstances. The functional test procedure is used to determine if the unit is functionally sound. If any of the tests in the functional test procedure do not pass, then the results of the FTP test are forwarded, along with the UUT, to a maintenance technician for analysis and repair. The technician will analyze the FTP results, and use a variety of test equipment, possible including the ATS, to manually troubleshoot the bad UUT to find the fault. Once the faulty components have been found, the UUT is sent to the repair bench where the bad components are replaced. The UUT is then again sent to the ATS to be retested. If the FTP fails again, then the process is repeated until the functional test procedure passes.

The procedures used in such functional tests, usually in printed form, provide minimal information about fault isolation, and generally require the maintenance technician to subject the UUT to further diagnostic procedures. Development of diagnostic procedures is time consuming, and is usually performed after the design of the UUT has been completed. Verification of teh accuracy of a diagnostic procedure is generally performed by fault insertion, an aproach that typically requires a considerable amount of rework of the UUT, or the building of a special UUT for verification purposes. Efforts have been made to eliminate some of these problems, by coding diagnostic procedures directly into functional test procedures. However, this approach has generally been unproductive, because ATS test time is significantly increased, and because the amount of software required to perform the combined FTP and diagnostic test procedure is increased by a factor of three or more.

There have been some preliminary attempts to use artificial intelligence systems to facilitate the functional testing of electronic systems. In general, these efforts have taken two directions. One direction has been to use expert system techniques to automatically produce functional test procedures for current automatic test systems. A second direction has been to develop expert systems for use by repair technicians, to supplement the technician's knowledge, and to permit the technician to diagnose faults in UUTs for which the technician has not been fully trained. The commercial utility of these approaches has yet to be determined.

SUMMARY OF THE INVENTION

The present invention provides a novel combination of ATS and artificial intelligence (AI) techniques. The central concept of the invention is to directly interface and AI system, such as an AI workstation, to a conventional ATS. Such as ATS typically comprises an ATE controller (a computer) and a set of electronic test instruments. In a conventional ATS arrangement, the ATE controller is directed by a human operator to execute functional test programs and/or diagnostic programs to determine the condition of a UUT. In the present invention, the interface between the ATE controller and AI workstation is the interface normally used between the ATE controller and the human operator. In particular, from the point of view of the ATE controller, the actions of the AI workstation are indistinguishable from the actions of an intelligent human operator.

More particularly, the present invention provides an apparatus and method for testing an electronic unit under test (UUT). The apparatus comprises an automatic test system, communication means, and an artificial intelligence (AI) system. The automatic test system comprises an automatic test equipment (ATE) controller, at lesat one test instrument connectable to the ATE controller and to the UUT, and storage means for storing a functional test procedure (FTP) of the UUT. The ATE controller includes an ATE port, and ATE data processing means for executing the FTP in response to a start FTP command. When the FTP is executed, the ATE data processing means provides an FTP data set at the ATE port. The FTP data set comprises data indicating the results obtained by executing the FTP. The AI system comprises an AI data processor having an AI port. The communication means is connected between the ATE port and the AI port. The AI system also comprises means for receiving the FTP data set via the communication means and the AI port, and expert systems means for processing the FTP data set when the FTP data set indicates that a failure has occurred. The expert system means identifies, if possible, the defective UUT portion that may have caused the failure, and produces output data that identifies such defective UUT portion.

In a preferred embodiment, the expert system means includes means for producing output data indicating that further testing should be performed. In such an embodiment, the storage means of the automatic test system may include a diagnostic test procedure (DTP) for the UUT. The ATE data processing means executes the DTP in response to a start DTP command, and provides a DTP data set at the ATE port. The DTP data set comprises data indicating the results obtained by executing the DTP. The AI data processor includes means for receiving the DTP data set via the AI port, and the expert system means includes meand for processing the DTP data. In a further preferred embodiment, the expert system means includes means for producing a DTP request message indicating that the DTP should be executed, and the AI data processor includes means responsive to the DTP request message for issuing the start DTP command at the AI port. The ATE data processor receives the start DTP command at the ATE port, and responds by executing the DTP.

DETAILED DESCRIPTION OF THE INVENTION

Figure 1:
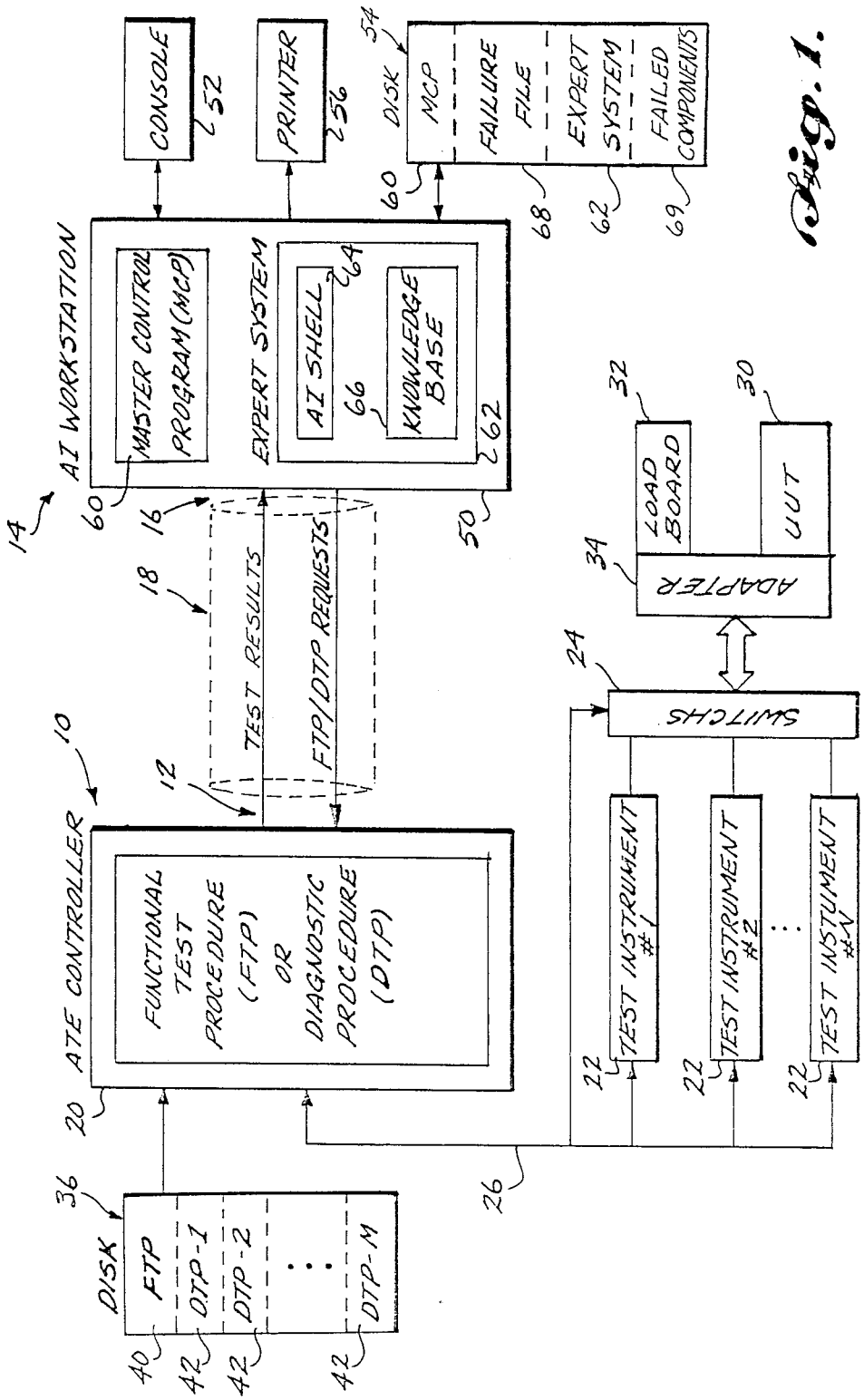
FIG. 1 is a schematic block diagram showing the testing apparatus of the present invention.

FIG. 1 schematically illustrates a preferred embodiment of the present invention. The embodiment shown in FIG. 1 includes automatic test system (ATS) 10 having I/O port 12 and artificial intelligence (AI) system 14 having I/O port 16. I/O ports 12 and 16 are connected by communication means 18. Communication means 18 may comprise any electrical, optical or other apparatus for directly transmitting data between ATS 10 and AI system 14. However, the present invention does contemplate a direct data link between the ATS and AI systems. Communication means 18 therefore does not comprise, for example, a human operator. In a preferred embodiment, the communication means comprises a standard bidirectional communication channel, such as an RS-232 serial interface. Use of a standardized communication channel significantly increases the flexibility of the system. In the configuration shown in FIG. 1, ATS 10 "sees" AI system 14 as an intelligent human operator, and AI system 14 "sees" ATS 10 as a smart peripheral device.

ATS 10 includes ATE controller 20, a set of N test instruments 22, and switches 24. ATE controller 20 controls test instruments 22 and switches 24 by means of signals produced by the ATE controller on bus 26, bus 26 preferably comprising an IEEE-488 bus or equivalent. UUT 30 and associated load board 32 are coupled to switches 24 through adapter 34.

ATE controller 20 includes an associated disk unit 36 on which a functional test procedure (FTP) 40 and one ormore diagnostic test procedures (DTPs) 42 are stored. The ATE controller also includes a suitable operating system (not illustrated) that can, upon request, load and execute the FTP or any one of the DTPs. When the functional test procedure or one of the diagnostic test procedures is running, the program causes signals to be issued on bus 26 that are received by test instruments 22 and switches 24, and that cause these components to apply predetermined test signals to UUT 30 via adapter 34 and load board 32. The test results, in the form of digitized values of voltages or other parameters, are then returned to the ATE controller via bus 26, and compared by the program to expected values. Typically, but FTP 40 and DTPs 42 will be written and adapted for a particular UUT.

AI system 14 comprises AT workstation 50, operator console 52 that includes a display screen and a keyboard, disk 54 and printer 56. The software for controlling AI workstation 50 includes master control program (MCP) 60 and expert system 62, expert system 62 comprising AI shell 64 and knowledge base 66.

Disk 54 contains MCP 60 and expert system 62, as well as failure file 68 and failed components file 69. Failure file 68 is used to store the results of failed tests performed by ATS 10. Failed components file 69 is used by the expert system to store the identification of components that the expert system determines to be defective. Automatic test system 10 shown in FIG. 1 is a system that is familiar to those skilled in the art, and that may be implemented using commercially available products. For example, ATE controller may comprise a Tektronics 4041 controller or a Hewlett Packard HP1000 controller. Furthermore, the development of functional test procedures and diagnostic test procedures for ATE controllers is a process that is well known to those skilled in the automatic testing arts. The FTP or DTPs will be written and adapted for a particular UUT. In a preferred embodiment, the only difference between ATS 10 in FIG. 1 and a conventional automatic test system in that I/O port 12 is connected to AI system 14, rather than to the computer terminal normally used by an operator.

AI system 14 can similarly be implemented using known components. For example, in one particular embodiment of the present invention, AI workstation 50 may comprise a Tektronics 4404 AT workstation, and AI shell 64 may comprise a commercially available AI shell OPS5 that is written in Franz LISP. Other AI shells and expert systems may also be used. Suitable examples and definitions of expert systems and related entities may be found in *A Guide to Expert Systems* by Donald A. Waterman, Addison-Wesley, 1986.

A simplified sequence of operations of the system shown in FIG. 1 will now be described. An operator initially logs onto the AI workstation via console 52, which causes the MCP to be loaded into memory from disk 54, and executed. The MCP produces an appropriate start FTP command at I/O port 16 that is received by ATE controller 20 via communication channel 18. It will be understood by those skilled in the art that references herein to a program taking an action are simply a shorthand way of stating that the associated data processor takes the specified action under the control of the specified program. In response to the start FTP signal, the ATE controller loads functional test procedure 40 from disk 36, and executes the FTP. The results produced by the FTP are transmitted back to AI workstation 50 via communication channel 18. Master control program 60 receives the FTP test results, transmits all test results to printer 56, and transmits test failure results to failure file 68 on disk 54. When the FTP is complete, ATE controller 20 sends an appropriate test-completed signal to AI workstation 50 via communication channel 18. If no failures have been detected, the master control program sends appropriate messages to console 52 and printer 56 indicating that the functional test has been successfully completed. However, if the result of any test was a failure, the master control program loads expert system 62 from disk 54, and transfer control to the expert system.

Expert system 62 reads failure file 68 on disk 54, and attempts to determine the cause of the failure. In particular, the expert system attempts to identify the precise logic block or component of UUT 30 that is not operating properly. In some cases, expert system 62 will be able to complete its analysis without further information, in which case the expert system reports the result of its analysis to master control program 60, and the master control program displays the expert system's conclusion via console 52 and printer 56. However in many cases, the expert system will be unable to deduce the precise cause of the failure based solely upon the results of running FTP 40. In such cases, the expert system will direct master control program 60 to request a particular diagnostic test procedure and the expert system will then wait for the completion of the diagnostic test procedure. In reponse to the request, the master control program will request execution of the specified diagnostic test procedure by a suitable start DTP message to ATE controller 20 via communication channel 18, and ATE controller will respond by loading and running the requested diagnostic test procedure. The results of the diagnostic test procedure are reported back to AI workstation 50 via communication channel 18, and the portions of the diagnostic procedure that resulted in failures are again stored in failure file 68 on disk 54. Expert system 62 will then be reactivated by the master control program, whereupon the expert system will analyze the DTP failure data, and will cause its conclusions to be displayed vai console 52 and printer 56. Additional DTPs are run at the discretion of the expert system, until the fault has been isolated to a single component or minimal group of components. The expert system keeps a record of its actions so that it will not request the same DTP twice.

Figure 2A:
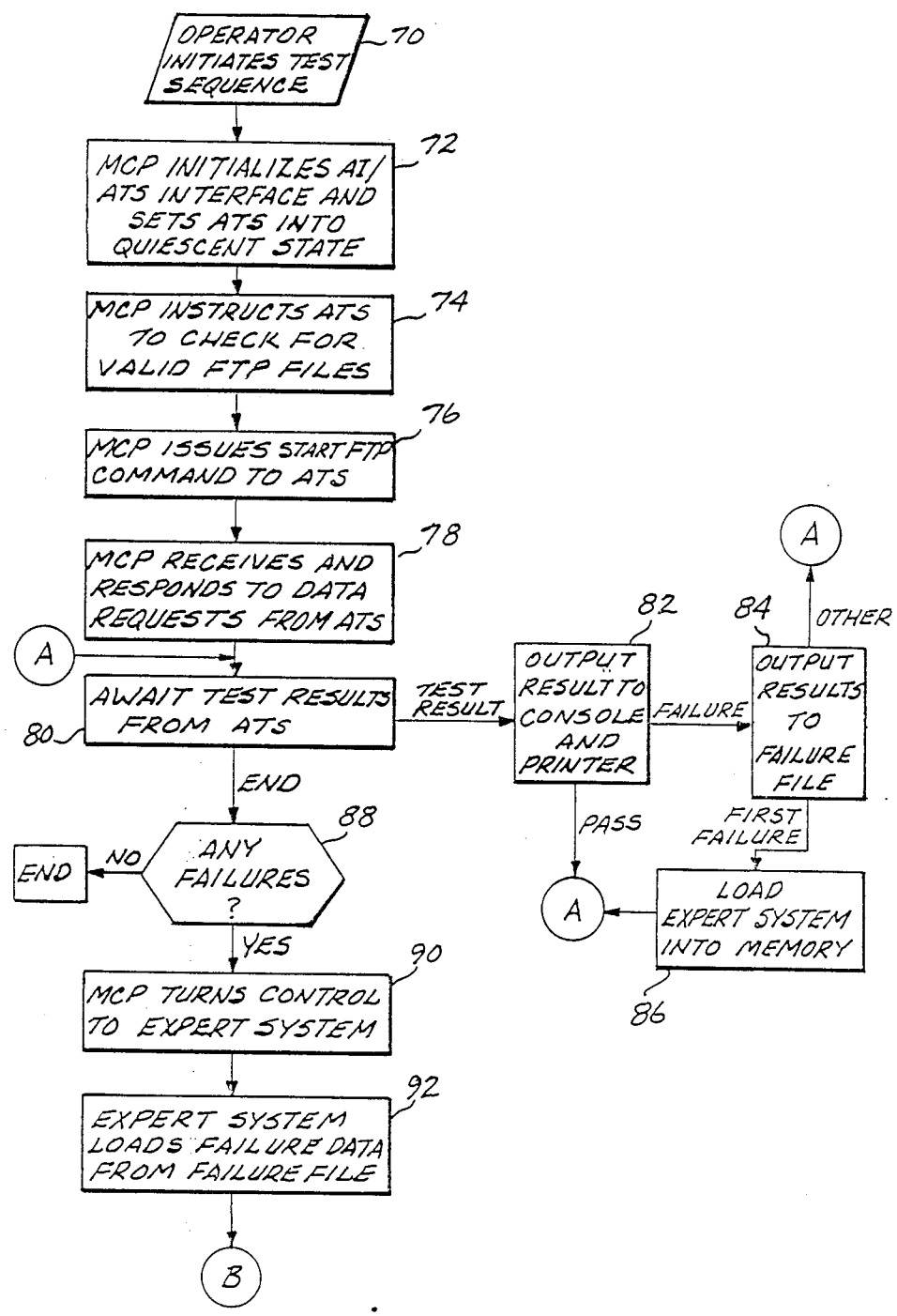
FIG. 2A and 2B are flow charts illustrating operation of the AI system.
Figure 2B:
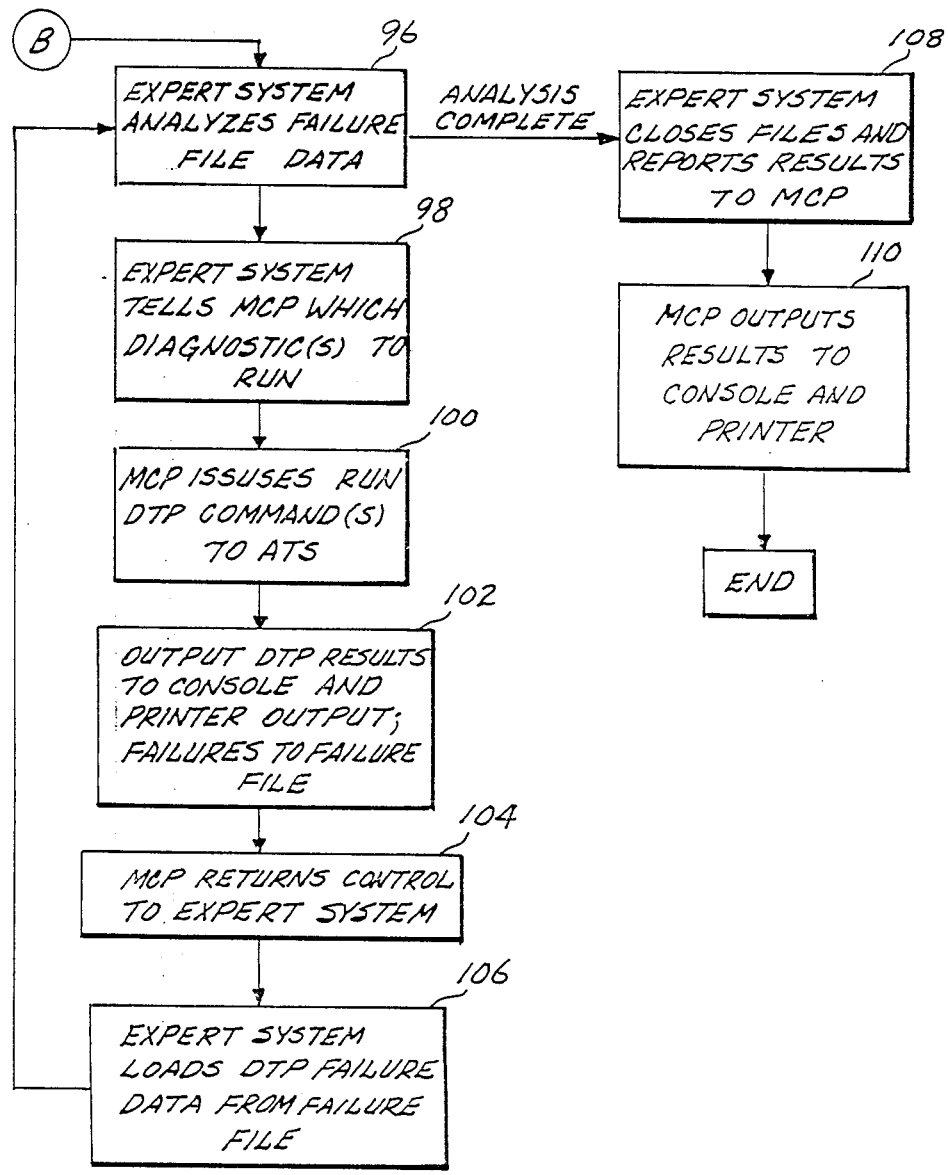

A representative example of the operation of AI workstation 50 is set forth in FIGS. 2A and 2B. At test sequence is initiated in block 70 by an operator activating a predetermined key or key sequence on console 52. Activation of the key causes the master control program to be loaded and run. In block 72, the MCP initiates the AI/ATE interface, and sends a message to the ATE controller that puts the ATE controller in a quiescent state in which the ATE controller is not conducting any tests but is ready to receive commands. In block 74, the MCP causes the ATE controller to check disk 36 for the existence of a valid FTP file. Assuming that a valid file is found and that this fact is transmitted back to the MCP, the MCP in block 76 then issues a start FTP command to the ATE controller. The ATE controller receives the start FTP command and commences execution of the FTP. The FTP may begin by requesting certain information, such as operator name, data, etc. The AI workstation receives such requests via communication channel 18, and sends the requested information back to ATS 10 vis the same communication channel.

In general, an FTP comprises a series of discrete tests. In each test, input signals are applied to a first set of UUT terminals, and the resulting output signals at a second set of UUT terminals are measured, and the values digitized and stored. The output signal values are then compared to expected values or ranges, and a determination of pass or fail is made. As each FTP test is completed, the results of that test are transmitted back to AI workstation 50 over communication channel 18. In block 80, the MCP awaits test results from the ATE controller. For each test result received, the MCP first causes the test result to be passed through to console 52 and printer 56. The MCP then determines if the test result indicated a failure. If a failure is detected, then the test result is also output to failure file 68 on disk 54. When the initial failure is detected, block 86 causes expert system 62 to be loaded into the memory of the AI workstation. This is done so that the expert system is ready for operation upon completion of the FTP.

When the FTP completes its predetermined sequence of tests, it sends a completion message to AI workstation 50. The MCP in block 88 then checks to determine whether any failures were encountered. If not, then the test sequence ends. If one or more failures are detected, then block 90 turns control of the AI workstation over to expert system 62. The expert system loads the failure file from disk 54 in block 92, and begins its analysis in block 96.

The analysis performed by the expert system in block 96 will be described in greater detail below. In general, such analysis can produce two results - a determination that further testing is required, or a completion of the analysis. In the former case, the expert system determines which diagnostic test procedure or procedures should be run, and request the running of such diagnostic test procedures from the MCP in block 98. In response, the MCP in block 100 issues start DTP commands to ATE controller 20 that causes the ATE controller to load and run the requested DTPs. As the individual test contained within the requested DTPs are run by the ATE controller, the results of such tests are passed back to AI workstation 50 via communication channel 18. The master control program outputs the DTP results to console 52 and printer 56, and outputs test failure data to the failure file on disk 54.

When the requested DTPs have been completed, the MCP returns control to the expert system in block 104. In block 106, the expert system loads the DTP failure data from the failure file, and the expert system then recommences its analysis in block 96. As before, the results of such analysis could either be a determination that more testing is required, or the expert system could determine that its analysis is complete. In the latter case, the expert system, in block 108, closes files and reports the results of the analysis to the MCP. In most cases, the results will identify the individual components of UUT 30 that the expert system believes are defective. In other cases, the expert system will be unable to isolate faults down to the single component level, and will instead report a group of components with specific degrees of confidence, and the logic blocks within which the faults have been found. In block 110, the MCP outputs the expert system's conclusions to the console and printer, and the test sequence is then complete.

Figure 3:
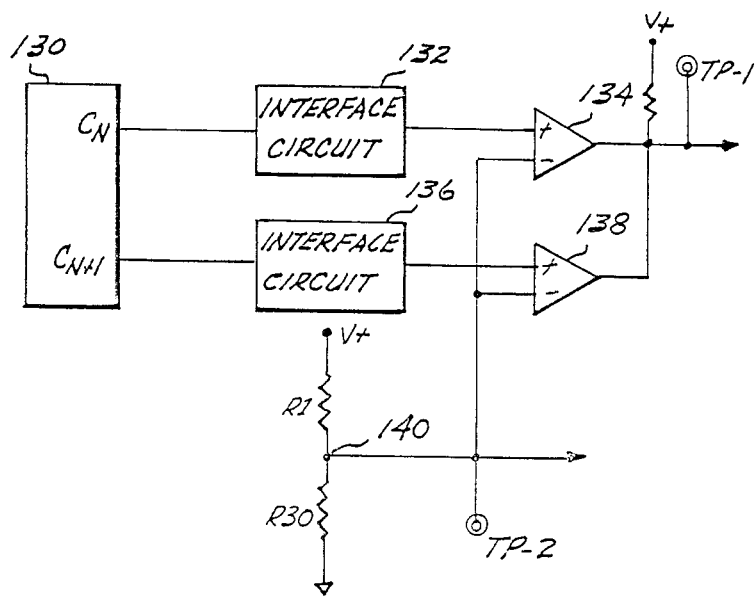
FIG. 3 is a circuit diagram showing a portion of a unit under test.

In order to more clearly set forth the nature of the present invention, operation of a suitable expert system will be described with respect to a portion of a particular UUT. Referring to FIG. 3, reference numeral 130 designates a multi-terminal connector for connecting the UUT to an instrument, backplane or the like. The electrical signal applied to terminal $C_N$ passes through interface circuit 132 to the noninverting input of comparator 134. The electrical signal applied to terminal $C_{N+1}$ passes through interface circuit 136 to the noninverting input of comparator 138. Both comparators are of the open collector type. A voltage divider network comprising resistors R1 and R30 provides a predetermined reference voltage of 2.7 volts DC at node 140 that is input to the inverting input of comparators 134 and 138, and that is also utilized by other portions (not shown) of the UUT. The circuit of FIG. 3 includes two test points, TP-1 for testing the output of comparators 134 and 138, and TP-2 for testing the reference voltage at node 140.

It will be assumed that the FTP for testing the circuit portion shown in FIG. 3 includes the following four tests, having the indicated test numbers 12-15:

12. Change $C_N$ from a high voltage level to a low voltage level, maintaining a high voltage level at $C_{N+1}$, and measure the time for the voltage at Tp-1 to go from a high level to a low level.
13. Change $C_{N+1}$ from a high voltage level to a low voltage level, maintaining a high voltage level at $C_N$, and measure the time for the voltage at TP-1 to go from a high level to a low level.
14. Change $C_N$ from a low voltage level to a high voltage level, maintaining a high voltage level at $C_{N+1}$, and measure the time for the voltage at TP-1 to go from a low level to a high level.
15. Change $C_{N+1}$ from a low voltage to a high voltage level, maintaining a high voltage level at $C_N$, and measure the time for the voltage at TP-1 to go from a low level to a high level.

It will also be assumed that one of the diagnostic test procedures 42 available in ATS 10 has the name VREF, and performs the following two tests:

1. Verify a voltage of approximately 2.7 volts DC at TP-2.
2. Verify an effective resistance to ground of 2000 ohms at TP-2 (due to the resistive divider).

For the purpose of the present invention, preferred expert systems are those that support forward chaining. In forward chaining, the expert system starts with a result (e.g., a test failure), and then attempts to establish the facts (e.g., that certain components are defective) needed to reach such results. One preferred class of expert systems includes those expert systems commonly referred to as production systems. An overview of a production system is provided in FIG. 4. The production system comprises memory 150 and inference engine 152. Memory 150 is a conventional random access memory that contains data objects 154 and knowledge base 66. Knowledge base 66 that comprises a set of rules, each of which may be thought of as an IF . . . THEN . . . statement, in which the IF clause contains one or more conditions (typically more than one), and in which the THEN clause specifies a series of actions to be taken if all of the conditions are true. In general, each condition comprises a statement specifying that a given data object with a specific value exists in memory 150. If the specified data object does in fact exist in such memory, and the value is correct, then the condition is true.

Each data object comprises a compound data structure having a class name that indicates the class to which the data object belongs, one or more attributes, and values for such attributes. For example, one class of data objects could be defined to be "Goals". Each Goal could further be defined to have three attributes: a name, a status, and a type. Each of these attributes could then be assigned specific values. The name attribute would simply be the name of a particular Goal. The status attribute would, for example, be "active", indicating that the Goal has not yet been achieved, or "satisfied", indicating that the Goal has been achieved. The type attribute could be used to distinguish between different groups of Goals. For example one Goal type could be "FTP", indicating that the Goal is associated with the functional test procedure, and a second Goal type could be "DTP", indicating that the Goal is associated with a diagnostic test procedure. Imagine, for example, that one of the data objects 154 was a Goal having a name "Read-FTP-Tests" and a status "active". One of the rules might be an IF . . . THEN . . . statement that when translated into English, would state that if there was a Goal (in memory 150) having the name "Read-FTP-Tests", and if that Goal had an "active" status, then read in a record from failure file 68 on disk 54. A more detailed explanation of this exmample will be provided below.

Inference engine 152 operates in a cyclic fashion to execute selected knowledge base rules. In particular, block 160 of the inference engine compares the data objects presently in memory 150 with the rules of knowledge base 66, and determines which rules are satisfied by the existing data. The set of satisfied rules is then passed to block 162. In block 162, the inference engine selects the single satisfied rule having the highest priority. Procedures for establishing priorities are well-known in the field of artificial intelligence, and will not be described herein. A typical priority rule might be that the rule having the highest number of conditions (i.e., a specific rule) has priority over a rule having a smaller number of conditions (i.e., a more general rule). Execution of the "THEN" portion of the selected rule in blcok 162 will commonly cause one or more of the data objects and/or rules in memory 150 to be modified. Control then passes back to block 160, at which point the data objects and rules are again compared, etc. The process ends when block 160 cannot find any satisfied rules, or when block 162 executes a rule that expressly stops the expert system.

The operation of a representative expert system with respect to the circuit shown in FIG. 3 will now be described. Table 1 sets forth the rules that relate to the testing of the circuit of FIG. 3. The rules are written in the OPS5 language that is well known in the arts relating to artificial intelligence and expert systems. In Table 1, the line numbers along the left hand margin of the table are provided for reference only, and do not form part of the rules themselves. Lines 1 through 52 of Table 1 comprise a series of literalize statements that define the indicated classes of data objects. For example, the literalize statement on lines 1-5 indicates the existence of a class of "FTP-Failed-Tests" data objects, and indicates that each such data object has four attributes: "test-number", "upper-limit", "lower-limit", and "measured-value". Lines 54-70 define the starting point for expert system operations, as well as the files used by the expert system. In particular, line 57 opens failure file 68, line 58 opens failed components file 69, and line 59 opens a file for communication with the MCP. Line 60 indicates that the default file for write operations is failed components file 69.

Figure 4:
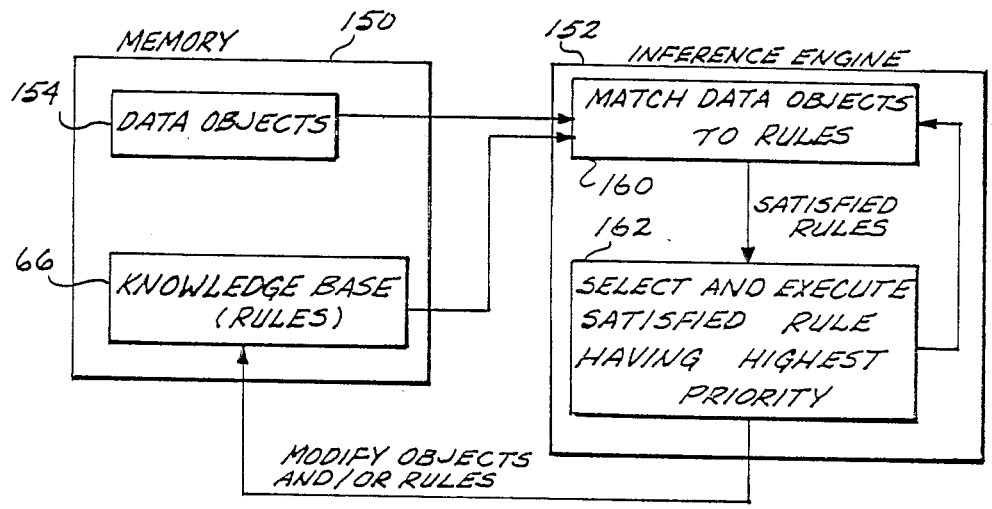
FIG. 4 is a schematic block diagram illustrating operation of a production system.

Lines 61-68 contain "make" statements that create specific data objects in memory 150 (see FIG. 4). For example, the make statement on line 68 creates a Goal data object having a name of "Read-FTP-Tests", and having a status of "active". Line 69 sends an acknowledgement message to the MCP, and line 70 waits for a response from the MCP. The response is bound to a dummy variable for later use, if necessary. The acknowledgement message allows the MCP to verify that the expert system is ready. Lines 72 and following contain the specific rules themselves.

Referring in particular to the rule set forth on line 72-83, line 72 contains the name of the rule, lines 73-75 indicate the conditions for executing or firing the rule, and lines 77-83 indicate the actions to take when the rule is fired. Line 76 identifies the dividing line (delimiter) between the IF and THEN portions of the rule. The condition on line 73, translated into English, reads as follows: "if there exists a goal having the name of "Read-FTP-Tests" and having a status of "active" . . . Since such a Goal is created by the make statement on line 68, this condition will initially be satisfied. Line 74 and 75 require an I/O status of anything but end-of-file (see lines 34-35), the minus sign preceding the condition on line 75 signifying that this condition requires the nonexistence rather than the existence of the indicated data object. If all of the conditions on lines 73-75 are satisfied, then the rule may be fired if the inference engine determines that it has the highest priority. Firing of the rule will cause the actions on lines 77-83 to be performed. The action on line 77 creates a dummy variable which removes unwanted data from the file. The action on lines 78-81 create a new FTP-Failed-Tests data object (see lines 1-5). The new data object has the indicated attributes, where the phrase "accept FTP" refers to failure file 68. Line 82 removes unwanted data from the file, and line 83 modifies the second condition of the rule, i.e., the I/O status is changed to "accept FTP" which checks for the end of the file.

Table 2 contains a trace listing illustrating the sequence of rules executed in response to the testing or a circuit that includes the circuit part shown in FIG. 3, in which resistor R30 was disconnected from the circuit i.e., an open circuit was created between resistor R20 and node 140. As in Table 1, the lines in Table 2 have been assigned numbers for ease of reference. Line 1 of Table 2 indicates the commencement of the expert system operation at start point Start 1. Lines 2-4 indicate repeated execution of the Read-FTP-Failed-Tests rule on lines 72-83 of Table 1. This rule is executed once for each record in the failure file. In this example, the error introduced into the circuit of FIG. 3 affects the reference voltage present at node 140, which reference voltage is used at a number of other portions in the circuit. This error thus resulted in a large number of test failures in other portions of the circuit of which the circuit of FIG. 3 is a part. Line 5 of Table 2 indicates execution of the End-Read-FTP-Tests rule shown at lines 85-93 of Table 1. Lines 6-8 indicate that the rule Invert-FTP-Test was then repeatedly executed, once for each failure file record received. This rule, in conjunction wiht the Remove-Invert-Test-Numbers rule described below, having the effect of inverting the failure file. This is performed because in the OPS5 AI shell, the last failure file record would ordinarily have the latest time tag, and therefore the highest priority. The failure file is therefore inverted, in order to cause the system to consider failures in the order in which they were detected by the functional test procedure.

The actual analysis commences beginning at line 13 of Table 2. Referring to lines 114-124 of Table 1, the indicated rule is satisfied as a result of the make statement at line 65 of Table 1. The execution of the rule creates a series of FGoal data objects. The creation of these FGoal data objects provides the conditions necessary for the execution of a large number of other rules throughout the knowledge base, one or more rules for each of the FGoal names. However, because the FGoal data object having the name Level-Blk1 was created last, it had the latest time stamp and therefore the highest priority. As a result, the rule indicated at lines 126-140 is executed next. As indicated, this rule fires whenever test numbers 12-15 have all failed. The actions taken when this rule is satisfied, at lines 139-140, create the condition required for the subsequent execution of the Activate-Diagnositic-Routine rule set forth at lines 142-155 (see line 15 of Table 2). Execution of this rule results in a request to the MCP to run the diagnostic test procedure having the name VREF.

Referring again to FIG. 2B, the MCP causes execution of the VREF diagnostic procedure by the ATE controller. As indicated previously, this diagnostic procedure contains two tests, both of which will fail when there is an open circuit between node 140 and resistor R30. At lines 16-19 of Table 2, the expert system, when reactivated, reads the new failure data from the failure file using the Read-Diagnostic-Test rule. This rule will be executed a total of three times, once for each of the failed DTP tests, and a third time for the end of file. At line 20, the Lockout-Diagnostic-Routine rule (Table 1, lines 185-191) is executed, thereby preventing refiring of the rule requesting the VREF diagnostic test procedure. At lines 21-27 of Table 2, the expert system again inverts the failures recorded by the diagnostic procedures. At line 28 of Table 2, the rule set forth at lines 212-218 of Table 1 is fired. This rule defines two LB1-Comp (logic block 1 component) data objects, of the type resistor, having names R1 and R30 respectively, and having confidence factors (CF) of zero. This rule also creates two DGoal (diagnostic goal) data objects, as indicated at lines 217 and 218. As a result of execution of this rule, the expert system executes the rule Test_R30 at lines 220-230 of Table 1.

The rule Test_R30 performs the key deduction in isolating the fault in this example. In particular, this rule determines that because tests 1 and 2 of DTP VREF failed, that resistor R30 is faulty. The firing of this rule removes the two Diagnostic-Test data objects having the name VREF, modifies the LB1-Comp data object having the name R30 to have a confidence factor (CF) of 0.96, and creates a goal having the name of abort. The rule Remove-DGOALS-LEVEL-BLK1 is then fired twice, thereby removing the two DGOALS created at lines 217 and 218 of Table 1. The rules indicated at lines 32-37 of Table 2 then terminate the expert system operations and report the results to the MCP via failed components file 69 on disk 54. The rule having the name abort is executed because of the creation of the goal having this name when the Test_R30 rule fired. The firing of the abort rule is based upon the determination by the creator of the knowledge base that a fault in resistor R30 is so basic that tests of other portions of the UUT cannot be deemed conclusive. The actual reporting of the bad component found by the expert system occurs when the rule indicated at lines 268-272 of Table 1 is fired. The output indicates a confidence factor of 0.96 (see line 229 of Table 1), a value assigned by the designer of the knowledge base, indicating the confidence an expert technician would have that resistor R30 is, in fact, defective. The MCP recognizes that the expert system has terminated by receipt of the "END" message produced by line 277. The MCP then sends the contents of failed components file 69 to printer 56 and console 52, and sends and EXIT command to ATS 10 to terminate the test process.

In a conventional testing procedure using an automatic testing system, test failure results produced by an FTP are printed out, and the printout, together with the UUT, as forwarded to an expert technician for further analysis. The technician then utilizes his or her knowledge to determine what diagnostic procedures to employ, and to isolate the faulty components or logic blocks. This knowledge could be found in repair manuals, but more frequently it is comprised of logical troubleshooting procedures that the technician has learned from experience. In the present invention, the AT workstation replaces both the operator of the ATS and the technician to whom the faulty UUTs are typically forwarded. The knowledge that the expert technician uses to troubleshoot a particular UUT is incorporated into the AI workstation memory in the form of knowledge base rules. The steps performed by the present invention could be accomplished by an expert technician operating the ATS, if the technician was aware of the testing abilities of each of the diagnostic test procedures. The reasoning used by the technician to determine the faulty component would be very similar to that used by the AI workstation. However, the use of an AI system to quote the ATS and to carry out diagnostic procedures results in a highly efficient testing process in which knowledge, in the form of knowledge base rules, can be continually refined and enhanced as experience with a particular UUT is required. The present invention also provides a test system in which knowledge can be readily shared between separate testing installations.

While the preferred embodiments of the invention have been illustrated and described, it is to be understood that variations will be apparent to those skilled in the art. Accordingly, the invention is not to be limited to hte specific embodiments illustrated and described, and the tru scope and spirit of the invention are to be determined by reference to the following claims.

TABLE 1

```
 1    (literalize  FTP-Failed-Tests
 2                 test-number
 3                 upper-limit
 4                 lower-limit
 5                 measured-value)
 6
 7    (literalize  Diagnostic-Tests
 8                 name
 9                 test-number
10                 upper-limit
11                 lower-limit
12                 measured-value)
13
14    (literalize  Diagnostic-Temp
15                 test-number)
16
17    (literalize  LB1-Comp
18                 type
19                 name
20                 CF)
21
22    (literalize  Goal
23                 name
24                 status
25                 type)
26
27    (literalize  FGoal
28                 name)
29
30    (literalize  DGoal
31                 name
32                 status)
33
34    (literalize  I/O
35                 status)
36
37    (literalize  lockout
38                 name)
39
40    (literalize  Diagnostic-Test-Vector
41                 name
42                 part-name
43                 value)
44
45    (literalize  Invert
46                 test-number)
47
48    (literalize  lockout-comp
49                 name)
50
51    (literalize  lockout-header
52                 name)
53
54    (p    Start
55           (start 1)
56           →
57           (openfile  FTP       FTP.FAIL    in)
58           (openfile  FAIL.COMP  FAIL.COMP  out)
```

TABLE 1-continued

```
59              (openfile Data    Data.st.ops    out)
60              (default FAIL.COMP write)
61              (make I/O    status active)
62              (make Goal    name Write-Diagnostic-Tests    status done)
63              (make Goal    name Invert-Diagnostic-Tests    status done)
64              (make Goal    name Read-Diagnostic-Tests    status done)
65              (make Goal    name Initialize-order-for-FTP-data-to-be-analyzed)
66              (make Goal    name Isolate-Fault    status active    type FTP)
67              (make Goal    name Invert-FTP-Tests    status active)
68              (make Goal    name Read-FTP-Tests    status active)
69              (write Data "OK"(crlf))
70              (bind <dummy>(accept)))
71
72      (p      Read-FTP-Failed-Tests
73              (Goal    name Read-FTP-Tests    status active)
74              (I/O    status <anything>)
75              (I/O    status end-of-file)
76      →
77              (bind<dummy>(accept FTP))
78              (make FTP-Failed-Tests    test-number (accept FTP)
79                                       upper-limit (accept FTP)
80                                       lower-limit (accept FTP)
81                                       measured-value (accept FTP))
82              (bind <dummyl >(accept FTP))
83              (modify 2    status (accept FTP)))
84
85      (p      End-Read-FTP-Tests
86              (Goal    name Read-FTP-Tests    status active)
87              (FTP-Failed-Tests    test-number end-of-file)
88              (I/O    status end-of-file)
89      →
90              (modify 1    status satisfied)
91              (remove 2)
92              (modify 3    status active)
93              (closefile FTP))
94
95      (p      Invert-FTP-Test
96              (Goal    name Invert-FTP-Tests    status active)
97              (FTP-Failed-Tests    test-number <TN>)
98              (Invert    test-number <TN>)
99      →
100             (modify 2    test-number <TN>)
101             (make Invert    test-number <TN>))
102
103     (p      End-Invert-FTP-Test
104             (Goal    name Invert-FTP-Tests    status active)
105     →
106             (modify 1    status satisfied))
107
108     (p      Remove-Invert-test-numbers
109             (Goal    name Invert-FTP-Tests    status satisfied)
110             (Invert    test number <TN>)
111     →
112             (remove 2))
113
114     (p      Initialize-order-for-FTP-data-to-be-analyzed
115             (Goal    name Initialize-order-for-FTP-data-to-be-analyzed)
116     →
117             (make FGoal    name Write-out-bad-components)
118             (make FGoal    name DLB4)
119             (make FGoal    name DLB2)
120             (make FGoal    name DLB3)
121             (make FGoal    name DLB1)
122             (make FGoal    name DLB5)
123             (make FGoal    name OSC)
124             (make FGoal    name Level-Blk1))
125
126     (p      Test-for-Level-Blk1
127             (FGoal    name Level-Blk1)
128             (Goal    name Isolate-Fault    status active    type FTP)
129             (FTP-Failed-Tests    test-number    12    )
130             (FTP-Failed-Tests    test number    13    )
131             (FTP-Failed-Tests    test number    14    )
132             (FTP-Failed Tests    test number    15    )
133             (lockout    name LB1)
134             (lockout    name VREF)
135     →
136             (modify 1    type DTP)
137             (make Goal    name Reactivate-FTPs)
138             (make Goal    name Initialize-components-LEVEL-BLK1)
139             (make Diagnostic-Tests    name VREF)
140             (make Goal    name Activate-Diagnostic-Routine))
```

TABLE 1-continued

```
141
142     (p      Activate-Diagnostic-Routine
143             (Goal    name Activate-Diagnostic-Routine)
144             (Goal    name Isolate-Fault    status active    type <<FTP DTP>>)
145             (Diagnostic-Tests    name    <diagnostic-routine>)
146             (Goal    name Read-Diagnostic-Tests    status done)
147             (lockout    name    <diagnostic-routine>)
148     →
149             (remove 1)
150             (closefile DTP)
151             (write Data (crlf) <diagnostic-routine>(crlf))
152             (bind <dummy>(accept))
153             (default FAIL.COMP write)
154             (openfile DTP    DTP.FAIL    in)
155             (modify 4    status active))
156
157     (p      Read-Diagnostic-Tests
158             (Goal    name Read-Diagnostic-Tests    status active)
159             (Diagnostic-Tests    name <diagnostic-routine>)
160             (I/O    status <anything>)
161             (I/O    status end-of-file)
162             (lockout    name <diagnostic-routine>)
163     →
164             (bind <dummy>(accept DTP))
165             (make Diagnostic-Tests    name <diagnostic-routine>
166                                       test-number (accept DTP)
167                                       upper-limit (accept DTP)
168                                       lower-limit (accept DTP)
169                                       measured-value (accept DTP)
170             (bind <dummy1> (accept DTP))
171             (modify 3    status (accept DTP)))
172
173     (p      End-Read-DTP-Tests
174             (Goal    name Read-Diagnostic-Tests    status active)
175             (Diagnostic-Tests    test-number end-of-file)
176             (I/O    status end-of-file)
177             (Goal    name Invert-Diagnostic-Tests    status done)
178     →
179             (modify 1    status done)
180             (remove 2)
181             (modify 3    status active)
182             (modify 4    status active)
183             (make Goal    name Lockout-Diagnostic-Routine))
184
185     (p      Lockout-Diagnostic-Routine
186             (Goal    name Lockout-Diagnostic-Routine)
187             (Diagnostic-Tests    name <Diagnostic-routine>)
188             (lockout    name <Diagnostic-routine>)
189     →
190             (make lockout    name <Diagnostic-routine>)
191             (remove 1))
192
193     (p      Invert-Diagnostic-Tests
194             (Goal    name Invert-Diagnostic-Tests    status active)
195             (Diagnostic-Tests    test-number <TN>)
196             (Invert    test-number <TN>)
197     →
198             (modify 2    test-number <TN>)
199             (make Invert    test-number <TN>))
200
201     (p      End-Invert-Diagnostic-Tests
202             (Goal    name Invert-Diagnostic-Tests    status active)
203     →
204             (modify 1    status done))
205
206     (p      Remove-Invert-test-number-from-Diagnostic-Tests-Just-Inverted
207             (Goal    name Invert-Diagnostic-Tests    status done)
208             (Invert    test-number <TN>)
209     →
210             (remove 2))
211
212     (p      Initialize-component-list-for-LEVEL-BLK1
213             (Goal    name Initialize-components-LEVEL-BLK1)
214     →
215             (make LB1-Comp    type resistor    name R1    CF 0.0)
216             (make LB1-Comp    type resistor    name R30    CF 0.0)
217             (make DGoal    name Remove-DGoals-LEVEL-BLK1)
218             (make DGoal    name Check-resistors))
219
220     (p      Test_R30
221             (DGoal    name Check-resistors)
222             (Goal    name Isolate-Fault)
```

TABLE 1-continued

```
223            (Diagnostic-Tests   name VREF    test-number 1)
224            (Diagnostic-Tests   name VREF    test-number 2)
225            (LB1-Comp    name R30)
226            (lockout    name LB1)
227         →
228            (remove 3 4)
229            (modify 5    CF 0.96)
230            (modify 2    status abort))
231
232        (p   Remove-DGoals-LEVEL-BLK1
233            (DGoal    name Remove-DGoals-LEVEL-BLK1)
234            (DGoal    name <any>)
235         →
236            (remove 2))
237
238        (p   Activate-the-writing-of-the-bad-components
239            (FGoal    name Write-out-bad-components)
240            (Goal    name Isolate-Fault    status <<active abort>>
241                                           type <<FTP DTP>>)
242         →
243            (make Goal    name Write-out-header    status active)
244            (make Goal    name Write-out-bad-comp))
245
246        (p   Write-out-header
247            (Goal    name Write-out-bad-comp)
248            (Goal    name Write-out-header    status active)
249         →
250            (write (crlf) (tabto 15) The following components are susptected
251                as faulty (crlf) (crlf)))
252
253        (p   abort
254            (Goal    name Write-out-bad-comp)
255            (Goal    status abort)
256         →
257            (write (crlf) A major fault has occurred this means that all the failed
258                (crlf) components could not be found.(crlf) (crlf) (crlf)))
259
260        (p   Header-for-level-blk1
261            (Goal    name Write-out-bad-comp)
262            (LB1-Comp    CF { > 0 })
263            (lockout-header    name LB1)
264         →
265            (make lock-out-header    name LB1)
266            (write (crlf) **** COMPONENTS IN LEVEL BLK 1 **** (crlf)))
267
268        (p   Write-out-failed-components-for-level-blk1-of-electronic-module
269            (Goal    name Write-out-bad-comp)
270            (LB1-Comp    name <comp1> ↑ CF {>0 <cf1>})
271         →
272            (write (crlf)(tabto 5) <comp1>---Confidence Factor <cf1>(crlf)))
273
274        (p   Close-DTP-and-FAIL.COMP-file
275            (Goal    name Write-out-bad-comp)
276         →
277            (write Data "end"(crlf))
278            (closefile DTP)
279            (closefile FAIL.COMP)
280            (closefile Data))
```

TABLE 2

| | |
|---|---|
| 1 | Start 1 |
| 2 | Read-FTP-Failed-Tests |
| 3 | . |
| 4 | Read-FTP-Failed-Tests |
| 5 | End-Read-FTP-Tests |
| 6 | Invert-FTP-Test |
| 7 | . |
| 8 | Invert-FTP-Tests |
| 9 | End-Invert-FTP-Test |
| 10 | Remove-Invert-test-numbers |
| 11 | . |
| 12 | Remove-Invert-test-numbers |
| 13 | Initialize-order-for-FTP-data-to-be-analyzed |
| 14 | Test-for-Level-Blk1 |
| 15 | Activate-Diagnostic-Routine |
| 16 | Read-Diagnostic-Tests |
| 17 | . |
| 18 | Read-Diagnostic-Tests |
| 19 | End-Read-DTP-Tests |
| 20 | Lockout-Diagnostic-Routine |
| 21 | Invert-Diagnostic-Tests |
| 22 | . |
| 23 | Invert-Diagnostic-Tests |
| 24 | End-Invert-Diagnostic Tests |
| 25 | Remove-Invert-test-numbers-from-Diagnostic-Tests-Just-Inverted |
| 26 | . |
| 27 | Remove-Invert-test-numbers-from-Diagnostic-Tests-Just- |

TABLE 2-continued

Inverted
28. Initialize-component-list-for-LEVEL-BLK1
29. Test__R30
30. Remove-DGoals-LEVEL-BLK1
31. Remove-DGoals-LEVEL-BLK1
32. Activate-the-writing-of-the-bad-components
33. Write-out-header
34. abort
35. Header-for-level-blk1
36. Write-out-failed-components-for-level-blk1-of-electronic-module
37. Close-DTP-and-FAIL.COMP-file The embodiments of the invention in which an exclusive property or privilege is claimed are defined as follows:

1. An apparatus for testing an electronic unit under test (UUT), comprising:
   (a) an automatic test system comprising an automatic test equipment (ATE) controller, at least one test instrument connectable to the ATE controller and to the UUT, and storage means for storing a functional test procedure (FTP) for the UUT, the ATE controller including an ATE port, and ATE data processing means for executing the FTP in response to a start FTP command and for providing an FTP data set at the ATE port, the FTP data set comprising data indicating the results obtained by executing the FTP;
   (b) communication means connected to the ATE port; and
   (c) an artificial intelligence (AI) system comprising an AI data processor having an AI port through which the AI data processor is connected to the communication means, means for receiving the FTP data set via the AI port, and expert system means for processing the FTP data set when the FTP data set indicates that a failure has occurred to identify, if possible, the defective UUT portion that may have caused the failure, and for producing output data that identifies the defective UUT portion.

2. The apparatus of claim 1, wherein the expert system means includes means for producing output data indicating that further testing should be performed.

3. The apparatus of claim 2, wherein the storage means of the automatic test system further stores a diagnostic test procedure (DTP) for the UUT, wherein the ATE data processing means executes the DTP in reponse to a start DTP command and provides a DTP data set at the ATE port, the DTP data set comprising data indicating the results obtained by executing the DTP, wherein the AI data processor includes means for receiving the DTP data set via the AI port, and wherein the expert system means includes means for processing the DTP port set when the DTP data set indicates that a failure has occurred to identify, if possible, the defective UUT portion that may have caused the failure, and for producing output data that indentifies the defective UUT portion.

4. The apparatus of claim 3, wherein the expert system means comprises means for producing a DTP request message indicating that the DTP should be executed, and wherein the AI data processor includes means reponsive to the DTP request message for issuing the start DTP command at that AI port, and wherein the ATE data processing means includes means for receiving the start DTP command at the ATE port.

5. A method of testing an electronic unit under test (UUT) comprising the steps of:
   (a) connecting the UUT to a testing apparatus comprising an automatic test system connected via communication means to an artificial intelligence (AI) system, the automatic system comprising an automatic test equipment (ATE) controller, at least one test instrument connectable to the ATE controller and to the UUT, and storage means for storing a functional test procedure (FTP) for the UUT, the AI system comprising an AI data processor and expert system means;
   (b) causing the ATE controller to execute the FTP, such that the ATE controller produces an FTP data set;
   (c) transmitting the FTP dat set to the AI system via the communication means; and
   (d) causing the expert system to process the FTP data set when the FTP data set indicates that a failure has occurred to identify, if possible, the defective UUT portion that may have caused the failure.

* * * * *